United States Patent
Verma

[11] Patent Number: 5,982,021
[45] Date of Patent: Nov. 9, 1999

[54] VERTICAL POLYSILICON DIODE COMPATIBLE WITH CMOS/BICMOS INTEGRATED CIRCUIT PROCESSES

[75] Inventor: Purakh Raj Verma, Woodlands, Singapore

[73] Assignee: Chartered Semiconductor Manufacturing, Ltd., Singapore, Singapore

[21] Appl. No.: 08/960,139

[22] Filed: Oct. 29, 1997

Related U.S. Application Data

[62] Division of application No. 08/803,467, Feb. 20, 1997, Pat. No. 5,716,880.

[51] Int. Cl.⁶ .................... H01L 27/082; H01L 29/70; H01L 31/11
[52] U.S. Cl. .................... 257/577; 257/518; 257/528; 257/532
[58] Field of Search .............. 257/67, 74, 328, 257/355, 577, 653, 528, 532, 516, 518

[56] References Cited

U.S. PATENT DOCUMENTS

| | | | |
|---|---|---|---|
| 4,246,502 | 1/1981 | Kubinec | 327/566 |
| 4,492,974 | 1/1985 | Yoshida et al. | 357/23 |
| 4,760,434 | 7/1988 | Tsuzuki et al. | 357/23.13 |
| 4,809,052 | 2/1989 | Nishioka et al. | 365/154 |
| 4,920,513 | 4/1990 | Takeshita et al. | 365/175 |
| 5,021,849 | 6/1991 | Pfiester et al. | 357/23.5 |
| 5,219,782 | 6/1993 | Liu et al. | 437/52 |
| 5,298,782 | 3/1994 | Sundaresan | 257/393 |
| 5,355,014 | 10/1994 | Rao et al. | 257/533 |
| 5,471,087 | 11/1995 | Buerger, Jr. | 257/532 |
| 5,668,380 | 9/1997 | Wuu et al. | 257/66 |

*Primary Examiner*—Mahshid Saadat
*Assistant Examiner*—George C. Eckert, II
*Attorney, Agent, or Firm*—George O. Saile; Rosemary L. S. Pike; Alek P. Szecsy

[57] ABSTRACT

A junction diode structure formed within an integrated circuit. The junction diode structure comprises a semiconductor substrate. The junction diode structure also comprises a dielectric layer formed over the semiconductor substrate. In addition, the junction diode structure also comprises a first polysilicon layer formed upon the dielectric layer, where the first polysilicon layer has a first dopant polarity and a first dopant concentration. Finally, the junction diode structure comprises a second polysilicon layer formed at least in part overlapping and at least in part in contact with the first polysilicon layer. The second polysilicon layer has a second dopant polarity and a second dopant concentration, where the second dopant polarity is opposite to the first dopant polarity, and where a first portion of the second polysilicon layer overlapping and in contact with a first portion of the first polysilicon layer forms a junction diode within the junction diode structure. The junction diode structure is particularly useful in forming junction diodes with increased junction area within integrated circuits.

5 Claims, 2 Drawing Sheets

VERTICAL POLYSILICON DIODE COMPATIBLE WITH CMOS/BICMOS INTEGRATED CIRCUIT PROCESSES

CROSS-REFERENCE TO RELATED APPLICATION

This application is a division of application Ser. No. 08/803,467, filed Feb. 20 1997, now U.S. Pat. No. 5,716,880, issued Feb. 10, 1998.

BACKGROUND OF THE INVENTION

1. Field of the Invention

The present invention relates generally to diodes formed within integrated circuits. More particularly, the present invention relates to high current carrying capacity polysilicon diodes formed within integrated circuits.

2. Description of the Related Art

Integrated circuits are formed from semiconductor substrates within and upon whose surfaces are formed resistors, transistors, capacitors and other electrical circuit elements. The electrical circuit elements are connected internally and externally to the semiconductor substrate upon which they are formed through patterned conductor layers which are separated by dielectric layers.

In addition to forming resistors, transistors and capacitors within integrated circuits, it is common in the art of integrated circuit fabrication to also employ diodes within integrated circuits. Diodes formed within integrated circuits may serve any of several functions, including but not limited to current rectification functions and electrostatic discharge protection functions.

While the use of diodes within integrated circuits has become quite common in the art of integrated circuit fabrication, the fabrication of diodes, and in particular junction diodes, within integrated circuits is not entirely without problems. In particular, as integrated circuit device densities continue to increase and integrated circuit device dimensions continue to decrease, it has become increasingly difficult to form through conventional structures and methods within advanced integrated circuits junction diodes which meet the needs, and in particular the current density requirement needs, of advanced integrated circuits.

Conventionally, junction diodes within complementary metal oxide semiconductor (CMOS) integrated circuits and bipolar complementary metal oxide semiconductor (BiCMOS) integrated circuits have been formed within monocrystalline silicon substrates within and upon which are formed those integrated circuits. Unfortunately, such a conventional junction diode may often not easily be operated in a forward bias mode since one of the junction diode electrodes is typically not available for biasing. In addition, such a conventional diode when properly biased may also often induce a parasitic effect, such as but not limited to parasitic latch-up effect with an adjoining junction transistor formed within the monocrystalline silicon substrate within which is formed the conventional junction diode, thus causing malfunction of the integrated circuit within which is formed the junction transistor. While the use of a lateral (ie: horizontal) polysilicon junction diode formed from a single polysilicon layer separated from a monocrystalline silicon substrate by a dielectric layer provides a junction diode construction not susceptible to either a forward biasing limitation or a parasitic effect, such a lateral polysilicon junction diode in general typically has a limited cross-sectional junction area (ie: typically less than about 5 square microns) and thus a relatively low current carrying capacity, unless fabricated with an exceedingly large projected surface area (ie: greater than about 200 square microns) upon the dielectric layer.

Diodes, in general, and polysilicon junction diodes, in particular, with relatively high current carrying capacity are typically desirable within integrated circuits which are employed to control or dissipate relatively high levels of electrical power. In that regard, polysilicon junction diodes with a relatively high current carrying capacity within advanced integrated circuits typically desirably have a junction area of greater than about 20 square microns (excluding any pertinent metal contact areas) through which is carried a current of about 8 to about 10 milliamps, in order to provide a junction diode current density of no greater than about 2.6E4 to about 3.3E4 amps per square centimeter. It is thus towards the goal of forming within integrated circuits junction diodes with relatively high current carrying capacity that the present invention is generally directed.

Various types of diode constructions for use within integrated circuits have been disclosed in the art of integrated circuit fabrication. For example, Tsuzuki et al., in U.S. Pat. No. 4,760,434 discloses a lateral planar junction diode construction formed upon an insulator layer within a control circuit of an integrated circuit, where the integrated circuit has both the control circuit and a power circuit surrounding the control circuit. The lateral planar junction diode construction serves as a heat sensing element within the control circuit employed to control the power circuit, thus avoiding overheating of the power circuit. In addition, Takeshita et al., in U.S. Pat. No. 4,920,513 disclose a junction diode formed within a semiconductor substrate adjoining a capacitor formed within and upon the semiconductor substrate. The junction diode and the capacitor provide a pair of active elements within a dynamic random access memory (DRAM) memory cell of reduced dimension formed within and upon the semiconductor substrate.

Further, Rao et al., in U.S. Pat. No. 5,355,014 discloses an integrated circuit device which comprises an integrated resistor and capacitor formed within a semiconductor substrate, along with a schottky diode formed within and upon the semiconductor substrate. The integrated circuit device is useful in filtering electromagnetic interference (EMI) and radio frequency interference (RFI) produced by high speed data lines in digital computers and computer peripherals. Finally, Buerger, Jr., in U.S. Pat. No. 5,471,087 discloses a semi-monolithic integrated circuit memory cell comprising a capacitor formed over a semiconductor substrate and two junction diodes formed within the semiconductor substrate. One of the two junction diodes is employed in charging the capacitor, while the other of the two junction diodes is employed in discharging the capacitor.

Desirable in the art are additional junction diode constructions which may be employed within integrated circuit fabrications. More desirable in the art are additional junction diode constructions which may be employed within integrated circuit fabrications which require junction diodes of comparatively high current carrying capacity, while simultaneously providing junction diode constructions not susceptible to parasitic effects, such as but not limited to parasitic latch-up effects, with other electrical circuit elements within the integrated circuits within which are formed the junction diode constructions, thus compromising operation of the integrated circuits within which are formed the junction diode constructions. Particularly desirable in the art are additional junction diode constructions which fulfill the foregoing criteria, where the junction diode constructions may readily be fabricated through conventional integrated circuit fabrication schemes and methods to provide junction diodes which may be biased in either a forward mode or a reverse mode. It is towards the foregoing goals that the present invention is more specifically directed.

SUMMARY OF THE INVENTION

A first object of the present invention is to provide a junction diode construction for use within an integrated circuit, along with a method for forming the junction diode construction for use within the integrated circuit.

A second object of the present invention is to provide a junction diode construction and a method for forming the junction diode construction in accord with the first object of the present invention, where the junction diode construction has a relatively high current carrying capacity.

A third object of the present invention is to provide a junction diode construction and a method for forming the junction diode construction in accord with the first object of the present invention and the second object of the present invention, where the junction diode formed within the junction diode construction may be biased in either a forward mode or a reverse mode.

A fourth object of the present invention is to provide a junction diode construction and a method for forming the junction diode construction in accord with the first object of the present invention, the second object of the present invention and the third object of the present invention, where the junction diode construction may readily be formed through integrated circuit fabrication schemes and methods conventional to the art of integrated circuit fabrication.

In accord with the objects of the present invention, there is provided by the present invention a junction diode construction, as well as a method for forming the junction diode construction. To practice the method of the present invention, there is first provided a semiconductor substrate. There is then formed over the semiconductor substrate a dielectric layer. There is then formed upon the dielectric layer a first polysilicon layer, where the first polysilicon layer has a first dopant polarity and a first dopant concentration. There is then formed at least in part overlapping and at least in part in contact with the first polysilicon layer a second polysilicon layer, where the second polysilicon layer has a second dopant polarity and a second dopant concentration. The second dopant polarity is opposite to the first dopant polarity. A first portion of the second polysilicon layer which overlaps and is in contact within a first portion of the first polysilicon layer comprises the junction diode. The method of the present invention contemplates a junction diode construction which is formed through the method of the present invention.

Through the present invention there is provided a junction diode construction for use within an integrated circuit, along with a method for forming the junction diode construction for use within the integrated circuit, where the junction diode construction has a relatively high current carrying capacity. By employing within the junction diode construction of the present invention a first polysilicon layer having formed thereupon at least in part overlapping and at least in part in contact a second polysilicon layer, where the second polysilicon layer has a polarity opposite the first polysilicon layer, there may be formed a junction diode construction having a comparatively high junction area. In contrast with a lateral (ie: horizontal) junction diode construction conventional in the art, where a junction area of the lateral junction diode construction is determined by the thickness and width of a single polysilicon layer formed upon a dielectric layer formed over a semiconductor substrate, the junction area of the vertical junction diode construction of the present invention is determined by an areal overlap of the second polysilicon layer with respect to the first polysilicon layer. Due to the relatively higher levels of areal overlap achievable within a vertical junction diode construction formed through the method of the present invention in comparison with the lateral junction diode construction conventional in the art, the junction diode construction of the present invention has a comparatively high current carrying capacity.

A junction diode formed within the junction diode construction of the present invention may be biased in either a forward mode or in a reverse mode. Since a junction diode formed within a junction diode construction formed through the method of the present invention is formed electrically isolated by a dielectric layer from a semiconductor substrate upon which is formed the junction diode construction, the junction diode may be biased in either a forward mode or a reverse mode. For similar reasons, the junction diode may be so biased without parasitic effects with respect to electrical circuit elements formed within and/or upon the semiconductor substrate upon which is formed the junction diode construction.

The junction diode construction of the present invention may readily be formed through integrated circuit fabrication schemes and methods conventional to the art of integrated circuit fabrication. Methods and materials through which there may be formed polysilicon layers in contact within other integrated circuit layers within integrated circuits are known in the art of integrated circuit fabrication. Given that there are also known in the art integrated circuit fabrication integrated circuit structures which require the use of two separate polysilicon layers when forming the integrated circuit structures (eg: planar polysilicon capacitors), the junction diode construction of the present invention may thus be formed through fabrication schemes and methods conventional to the art of integrated circuit fabrication, with minimal, if any, additional integrated circuit processing.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a junction diode construction for use within an integrated circuit, and a method for forming the junction diode construction for use within the integrated circuit, where the junction diode construction has a relatively high current carrying capacity. The present invention achieves the foregoing goal by forming upon a dielectric layer formed over a semiconductor substrate a first polysilicon layer which in turn has formed thereupon at least in part overlapping and at least in part in contact a second polysilicon layer. The first polysilicon layer has a first dopant polarity and a first dopant concentration, while the second polysilicon layer has a second dopant polarity and a second dopant concentration, where the second dopant polarity is opposite of the first dopant polarity.

Although the preferred embodiments of the present invention illustrate the junction diode construction of the present invention formed within an integrated circuit incorporating therein a bipolar transistor and a field effect transistor (FET), thus forming an integrated circuit having formed therein a portion of a bipolar complementary metal oxide semiconductor (BiCMOS) transistor structure, the junction diode construction of the present invention may be formed within integrated circuits having formed therein integrated circuit structures other than bipolar complementary metal oxide semiconductor (BiCMOS) transistor structures. Typically and preferably, although not exclusively, the junction diode construction of the present invention will be employed within integrated circuits which require diode constructions having comparatively high current carrying capacity. Such integrated circuits are typically, although not exclusively, integrated circuits through which are processed analog signals or analog signals in conjunction with digital signals. However, such integrated circuits may also include, but are not limited to, integrated circuits employed in power control applications.

Figure 1:
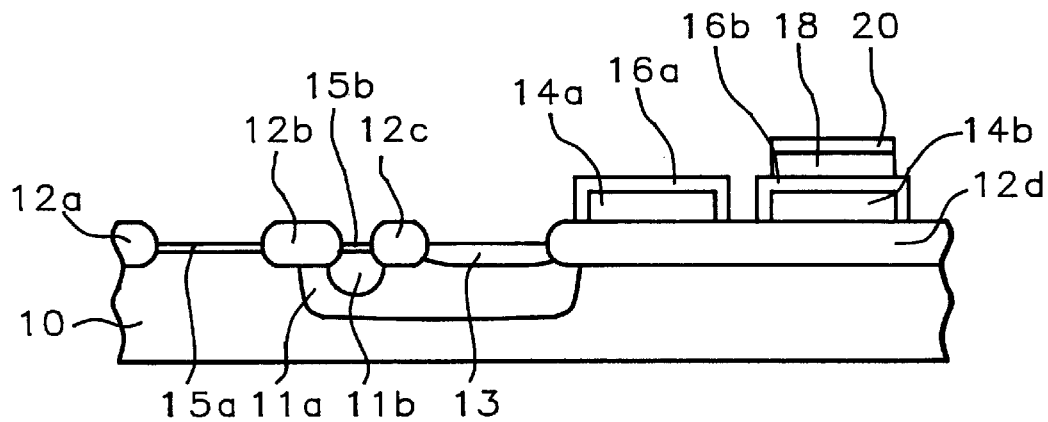
FIG. 1 to FIG. 3 show a series of schematic cross-sectional diagrams illustrating the results of progressive stages in forming within an integrated circuit a junction diode construction in accord with a first preferred embodiment of the present invention.
Figure 2:
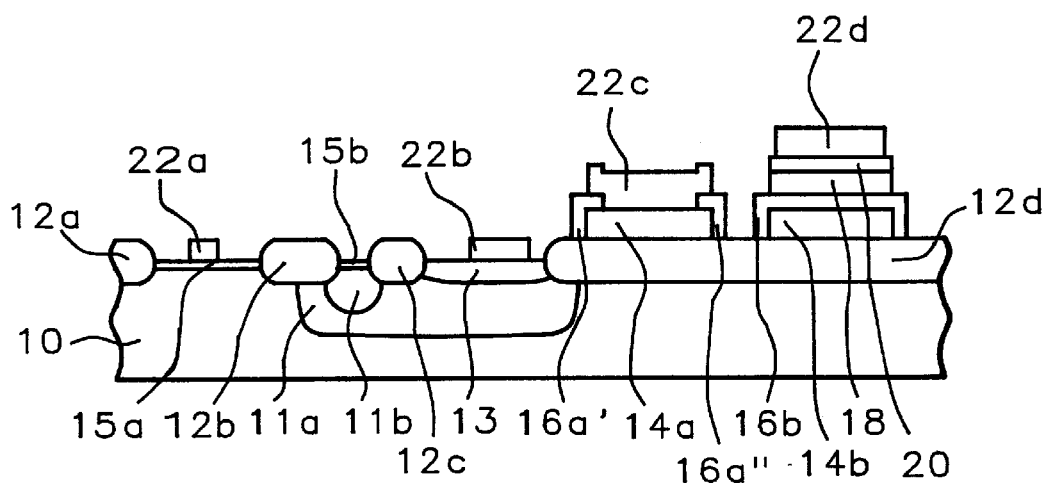
Figure 3:
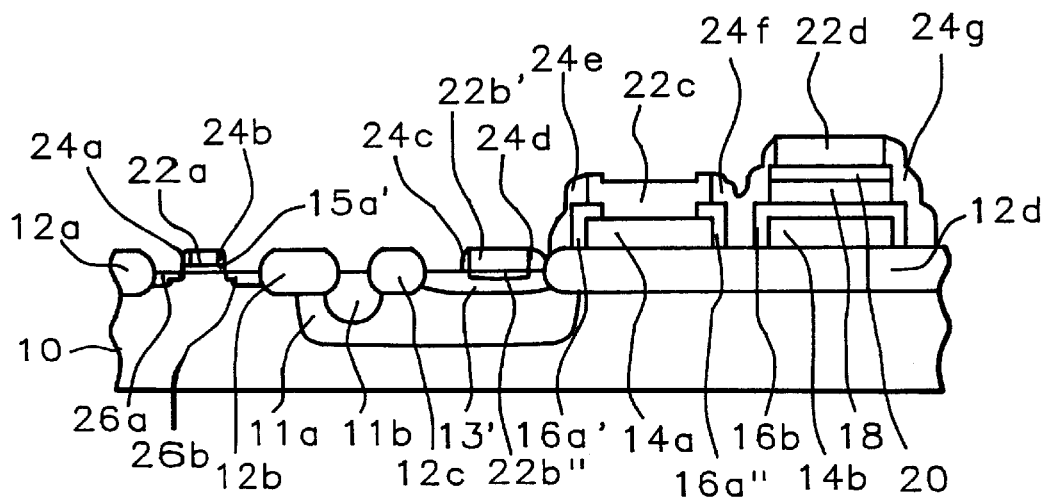

Referring now to FIG. 1 to FIG. 3, there is shown a series of schematic cross-sectional diagrams illustrating the results of progressive stages in forming within an integrated circuit a junction diode construction in accord with a first preferred embodiment of the present invention. Shown in FIG. 1 is a schematic cross-sectional diagram of the integrated circuit at an early stage in its fabrication.

Shown in FIG. 1 is a semiconductor substrate 10 having formed within and upon its surface a series of isolation regions 12a, 12b, 12c and 12d which define a series of active regions of the semiconductor substrate 10. Although semiconductor substrates are known in the art with either dopant polarity, various dopant concentrations and several crystallographic orientations, for the first preferred embodiment of the present invention, the semiconductor substrate 10 is preferably a (100) silicon semiconductor substrate having an N- or P- doping, typically at a dopant concentration of from about 1E15 to about 5E15 dopant atoms per cubic centimeter. Similarly, although it is also known in the art that isolation regions may be formed within and/or upon semiconductor substrates through methods including but not limited to isolation region thermal growth methods and isolation regions deposition/patterning methods, for the first preferred embodiment of the present invention the isolation regions 12a, 12b, 12c and 12d are preferably formed through an isolation region thermal growth method at a temperature of from about 850 to about 1000 degrees centigrade to form isolation regions 12a, 12b, 12c and 12d of silicon oxide within and upon the semiconductor substrate 10.

Formed within the semiconductor substrate 10, as illustrated in FIG. 1, is a collector tub region 11a, a collector contact region 11b and a base region 13. The collector tub region 11a, the collector contact region 11b and the base region 13 may be formed through methods as are conventional in the art, which will typically, although not exclusively, include ion implantation methods as are known in the art. Within the first preferred embodiment of the present invention, the collector tub region 11a is preferably formed of a dopant polarity opposite the dopant polarity of the semiconductor substrate 10. Preferably, the collector tub region 11a has a dopant concentration of from about 5E16 to about 1E17 dopant atoms per cubic centimeter. Preferably, the collector tub region 11a is formed to a junction depth within the semiconductor substrate 10 of from about 35000 to about 45000 angstroms. Similarly, within the first preferred embodiment of the present invention, the collector contact region 11b is preferably formed with a dopant polarity equivalent to the dopant polarity of the collector tub region 11a, but with a significantly higher dopant concentration of from about 1E19 to about 1E20 dopant atoms per cubic centimeter. Preferably, the collector contact region 11b is formed to a depth within the collector tub region 11a of from about 25000 to about 32000 angstroms. Finally, within the first preferred embodiment of the present invention, the base region 13 is formed with a dopant polarity opposite to the dopant polarity of both the collector tub region 11a and the collector contact region 11b. Preferably, the base region 13 has a dopant concentration of from about 2E17 to about 5E17 dopant atoms per cubic centimeter. Preferably the base region 13 is formed to a junction depth within the collector tub region 11a of from about 900 to about 1500 angstroms.

In order to form the collector tub region 11a, the collector contact region 11b and the base region 13 within the integrated circuit whose schematic cross-sectional diagram is illustrated in FIG. 1, there is typically required, although not specifically illustrated within FIG. 1, several masking process steps, ion implantation process steps and annealing process steps. Typically and preferably, although not exclusively, the collector tub region 11a is formed within the semiconductor substrate 10 prior to forming the isolation regions 12a, 12b, 12c and 12d within and upon the semiconductor substrate 10, while the collector contact region 11b and the base region 13 are typically and preferably, although not exclusively, formed within the semiconductor substrate 10 after the isolation regions 12a, 12b, 12c and 12d are formed within and upon the semiconductor substrate 10.

There is also shown in FIG. 1 formed upon the isolation region 12d a patterned first polysilicon layer 14a and a patterned first polysilicon layer 14b, each of which has a first dopant polarity and a first dopant concentration. Methods and materials through which patterned polysilicon layers may be formed within integrated circuits are known in the art of integrated circuit fabrication. Patterned polysilicon layers are typically, although not exclusively, formed within integrated circuits through patterning through methods as are conventional in the art, of blanket polysilicon layers formed within integrated circuits. In turn, blanket polysilicon layers may be formed within integrated circuits through methods including but not limited to chemical vapor deposition (CVD) methods, plasma enhanced chemical vapor deposition (PECVD) methods and physical vapor deposition (PVD) sputtering methods employing suitable silicon target materials or silicon source materials such as, but not limited to silane and disilane.

Within the first preferred embodiment of the present invention, the patterned first polysilicon layers 14a and 14b may be formed employing any of the foregoing methods and materials. Preferably, each of the patterned first polysilicon layers 14a and 14b is formed upon the isolation region 12d to a thickness of from about 2000 to about 4000 angstroms. Preferably, the first dopant polarity of each of the patterned first polysilicon layers 14a and 14b is opposite to the dopant polarity of the collector tub region 11a and the collector contact region 11b. Preferably, the first dopant concentration of each of the patterned first polysilicon layers 14a and 14b is from about 1E17 to about 1E20 dopant atoms per cubic centimeter. The first dopant concentration may be incorporated into each of the patterned first polysilicon layers 14a and 14b through methods as are conventional in the art, including but not limited to ion implantation methods and chemical vapor deposition (CVD) co-deposition methods.

There is also shown in FIG. 1 formed upon the patterned first polysilicon layer 14a a patterned first dielectric layer 16a and formed upon the patterned first polysilicon layer 14b a patterned first dielectric layer 16b. Within the first preferred embodiment of the present invention, the patterned first dielectric layer 16a and the patterned first dielectric layer 16b are, as is illustrated in FIG. 1, preferably formed in a self-aligned fashion upon exposed portions of either the patterned first polysilicon layer 14a or the patterned first polysilicon layer 14b. To form the patterned first dielectric layer 16a and the patterned first dielectric layer 16b in such a fashion, the patterned first dielectric layer 16a and the patterned first dielectric layer 16b within the first preferred embodiment of the present invention are preferably formed through a thermal oxidation method whereby a portion of each of the precursor layers to the patterned first polysilicon layer 14a and the patterned first polysilicon layer 14b is consumed in forming the patterned first dielectric layer 16a and the patterned first dielectric layer 16b, thus forming the patterned first dielectric layer 16a and the patterned first dielectric layer 16b of silicon oxide. Preferably, the patterned first dielectric layer 16a and the patterned first dielectric layer 16b so formed are each from about 150 to about 300 angstroms in thickness. In the alternative, other methods and materials may also be employed in forming within the integrated circuit whose schematic cross-sectional diagram is illustrated in FIG. 1 patterned dielectric layers which serve the function of the patterned first dielectric layers 16a and 16b.

There is also shown in FIG. 1 formed upon the patterned first dielectric layer 16b a patterned first capacitor dielectric layer 18 having formed and aligned thereupon a patterned second capacitor dielectric layer 20. Although any of several methods and materials may be employed in forming the patterned first capacitor dielectric layer 18 and the patterned second capacitor dielectric layer 20, including but not limited to chemical vapor deposition (CVD) methods, plasma enhanced chemical vapor deposition (PECVD) methods and physical vapor deposition (PVD) sputtering methods through which may be formed capacitor dielectric layers of dielectric materials including but not limited to silicon oxide dielectric materials, silicon nitride dielectric materials and silicon oxynitride dielectric materials, the patterned first capacitor dielectric layer 18 is preferably formed through patterning through methods as are conventional in the art of a blanket first capacitor dielectric layer formed of a silicon nitride capacitor dielectric material formed to a thickness of from about 200 to about 400 angstroms, while the patterned second capacitor dielectric layer 20 is preferably formed through patterning through methods as are conventional in the art, of a blanket second capacitor dielectric layer formed of a silicon oxide capacitor dielectric material formed to a thickness of from about 20 to about 100 angstroms.

Finally, there is shown in FIG. 1 the presence of: (1) a blanket gate dielectric layer 15a formed upon the active region of the semiconductor substrate 10 defined by the isolation regions 12a and 12b; and (2) a blanket sacrificial dielectric layer 15b formed upon collector contact region 11b. Although it is known in the art that blanket gate dielectric layers and blanket sacrificial dielectric layers may be formed upon active regions of semiconductor substrates through methods including but not limited to blanket gate dielectric layer or blanket sacrificial dielectric layer thermal growth methods and blanket gate dielectric layer or blanket sacrificial dielectric deposition/patterning methods, for the first preferred embodiment of the present invention, the blanket gate dielectric layer 15a and the blanket sacrificial dielectric layer 15b are preferably formed, respectively, upon the active region of the semiconductor substrate 10 defined by the isolation regions 12a and 12b or upon the collector contact region 11b through a simultaneous blanket gate dielectric layer and blanket sacrificial dielectric layer thermal growth method at a temperature of from about 850 to about 1000 degrees centigrade to simultaneously form the blanket gate dielectric layer 15a and the blanket sacrificial dielectric layer 15b of silicon oxide, each having a thickness of about 100 to about 200 angstroms.

Although not specifically illustrated by the schematic cross-sectional diagram of FIG. 1, the ordering for formation of the various layers and regions formed within the integrated circuit whose schematic cross-sectional diagram is illustrated in FIG. 1 may be modified to accommodate various alternative integrated circuit processing sequences.

Referring now to FIG. 2, there is shown a schematic cross-sectional diagram illustrating the results of further processing of the integrated circuit whose schematic cross-sectional diagram is illustrated in FIG. 1. Shown in FIG. 2 is the results of: (1) further patterning of the patterned first dielectric layer 16a to form the etched patterned first dielectric layers 16a' and 16a"; and (2) forming several patterned second polysilicon layers upon the resulting integrated circuit structure. The patterned first dielectric layer 16a may be further patterned to form the etched patterned first dielectric layers 16a' and 16a" through methods as are convention in the art, which will typically, although not exclusively, include reactive ion etch (RIE) plasma etch methods or wet chemical etch methods. The additional patterned second polysilicon layers may be formed through patterning, through methods as are conventional in the art, of a blanket second polysilicon layer formed employing methods and materials analogous to the methods and materials employed in forming the patterned first polysilicon layers 14a and 14b. As is illustrated in FIG. 2, the additional patterned second polysilicon layers comprise: (1) a patterned polysilicon gate electrode 22a formed upon the blanket gate dielectric layer 15a; (2) a patterned polysilicon emitter electrode 22b formed upon the base region 13; (3) a patterned polysilicon diode electrode 22c formed at least in part overlapping and at least in part in contact with portions of the patterned first polysilicon layer 14a exposed through the etched patterned first dielectric layers 16a' and 16a"; and (4) a patterned polysilicon capacitor plate 22d formed upon the patterned second capacitor dielectric layer 20. Preferably, the patterned polysilicon gate electrode layer 22a, the patterned polysilicon emitter electrode 22b, the patterned polysilicon diode electrode 22c and the patterned polysilicon capacitor plate 22d each have a thickness of from about 2000 to about 4000 angstroms. Within the first preferred embodiment of the method of the present invention, each of the foregoing patterned second polysilicon layers is preferably formed with a dopant polarity equivalent to the dopant polarity of the collector tub region 11a and the collector contact region 11b. Preferably, the dopant concentration within each of the foregoing patterned second polysilicon layers is from about 1E18 to about 1E20 dopant atoms per cubic centimeter.

As is understood by a person skilled in the art, within FIG. 2 the patterned first polysilicon layer 14a and the patterned polysilicon diode electrode 22c form a novel vertical polysilicon diode construction formed through the first preferred embodiment of the method of the present invention. In comparison with a lateral (ie: horizontal) polysilicon diode construction conventional in the art of integrated circuit fabrication, the novel vertical polysilicon diode construction formed through the first preferred embodiment of the method of the present invention and comprised of the patterned first polysilicon layer 14a and the patterned polysilicon diode electrode 22c will typically and preferably have a substantially higher junction area, and therefore higher current carrying capacity, since the junction area of the novel vertical polysificon diode construction formed through the first preferred embodiment of the method of the present invention is determined by the projected contact area of the patterned first polysilicon layer 14a with the patterned polysilicon diode electrode 22c rather than by the width and thickness of a single patterned polysilicon layer which would otherwise be employed in forming the conventional lateral polysilicon diode construction. Within the first preferred embodiment of the present invention, the projected contact area of the patterned first polysilicon layer 14a with the patterned polysilicon diode electrode 22c is preferably from about 20 to about 30 square microns, which will typically provide a vertical polysilicon diode of about 10 milli-amps current carrying capacity. It is, however, understood by a person skilled in the art that vertical polysilicon junction diode constructions having higher or lower current carrying capacity may be formed through the method of the present invention by providing first polysilicon layers and polysilicon diode electrodes having commensurately higher or lower projected contact areas. For comparison purposes, a conventional lateral polysilicon diode formed from a single polysilicon layer of similar areal and thickness dimensions will typically have a current carrying capacity of about 1.5 milli-amps.

Similarly, as is also understood by a person skilled in the art, the patterned first polysilicon layer 14b, the patterned first dielectric layer 16b, the patterned first capacitor dielectric layer 18, the patterned second capacitor dielectric layer 20 and the patterned polysilicon capacitor plate 22d form a planar polysilicon capacitor adjoining but separated from the vertical polysilicon junction diode construction also formed upon the isolation region 12d.

Referring now to FIG. 3, there is shown a schematic cross-sectional diagram illustrating the results of further processing of the integrated circuit whose schematic cross-sectional diagram is illustrated in FIG. 2. Shown in FIG. 3 is the presence of: (1) a pair of insulator spacer layers 24a and 24b formed adjoining opposite edges of the patterned polysilicon gate electrode 22a; (2) a pair of insulator spacer layers 24c and 24d formed adjoining opposite edges of a depleted patterned polysilicon emitter electrode 22b; (3) an insulator spacer layer 24e formed adjoining the side of the vertical polysilicon diode construction opposite the planar polysilicon capacitor formed upon the isolation region 12d; (4) an insulator spacer layer 24f formed separating the vertical polysilicon diode construction formed upon the isolation region 12d from the planar polysilicon capacitor formed upon the isolation region 12d; and (5) an insulator spacer layer 24g formed adjoining the side of the planar polysilicon capacitor opposite the vertical polysilicon diode construction formed upon the isolation region 12d. The foregoing series of insulator spacers 24a, 24b, 24c, 24d, 24e, 24f and 24g may be formed through methods as are conventional in the art, which will typically employ an anisotropic etching of a blanket layer of insulator spacer material formed upon the integrated circuit whose schematic cross-sectional diagram is illustrated in FIG. 2. Typically and preferably, the blanket layer of insulator spacer material is formed from an insulator spacer material such as, but not limited to a silicon oxide insulator spacer material, a silicon nitride insulator spacer material or a silicon oxynitride insulator spacer material. When forming the insulator spacers 24a and 24b, the blanket gate dielectric layer 15a is typically also simultaneously patterned to form a patterned gate dielectric layer 15a', as is also illustrated in FIG. 3. Similarly, when forming the insulator spacers 24a, 24b, 24c, 24d, 24e, 24f and 24g the blanket sacrificial dielectric layer 15b is typically etched from the surface of the collector contact region 1b.

There is also shown in FIG. 3 the presence of a pair of source/drain regions 26a and 26b formed into portions of the active region of the semiconductor substrate 10 defined by the isolation regions 12a and 12b at locations other than those occupied by the patterned polysilicon gate electrode 22a. Typically and preferably, the source/drain regions 26a and 26b are formed through a successive two-step ion implantation process comprising: (1) a first ion implantation process step employing an ion implantation dose of from about 1.5E13 to about 3.5E13 ions per square centimeter and an ion implantation energy of from about 50 to about 80 keV employed prior to forming the insulator spacers 24a and 24b; followed by (2) a second ion implantation process step employing an ion implantation dose of from about 3E15 to about 6E15 ions per square centimeter and an ion implantation energy of from about 60 to about 100 keV employed after forming the insulator spacers 24a and 24b. The polarity of the dopant ions employed within each of the two process steps within the two step ion implantation process is preferably equivalent to the polarity of the dopant atoms employed in forming the collector tub region 11a and the collector contact region 11b.

Finally, there is shown in FIG. 3 the presence of a diff-used emitter region 22b" formed within a thinned base region 13' incident to outdiffusion of dopant atoms from the depleted patterned polysilicon emitter electrode 22b'. Such outdiffusion occurs due to the substantial dopant concentration of the patterned polysilicon emitter electrode 22b and dopant concentration gradient of the patterned polysilicon emitter electrode 22b with respect to the base region 13, in conjunction with additional thermal annealing of the semiconductor substrate 10 as illustrated in FIG. 3 typically incident to forming the source/drain regions 26a and 26b. Typically, the junction depth of the diffused polysilicon emitter region 22b" within the thinned base region 13' is from about 500 to about 800 angstroms.

Upon forming the source/drain regions 26a and 26b within the integrated circuit whose schematic cross-sectional diagram is illustrated in FIG. 3, there is formed through the first preferred embodiment of the present invention a portion of a bipolar complementary metal oxide semiconductor (BiCMOS) integrated circuit having further formed therein a planar polysilicon capacitor and a vertical polysilicon diode construction, where the vertical polysilicon diode construction has a high current carrying capacity. In addition, the vertical polysilicon diode construction may be biased in either a forward mode or a reverse mode.

In addition to the first preferred embodiment of the present invention and the vertical polysilicon diode construction formed through the first preferred embodiment of the present invention, there also exists a second preferred embodiment of the present invention and a corresponding vertical polysilicon diode construction formed through the second preferred embodiment of the present invention.

Figure 4:
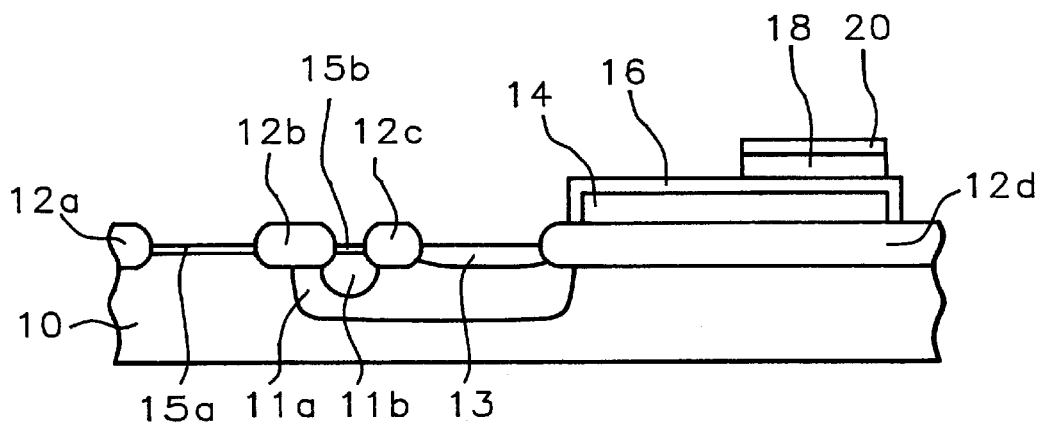
FIG. 4 to FIG. 6 show a series of schematic cross-sectional diagrams illustrating the results of progressive stages in forming within an integrated circuit a junction diode construction in accord with a second preferred embodiment of the present invention.
Figure 5:
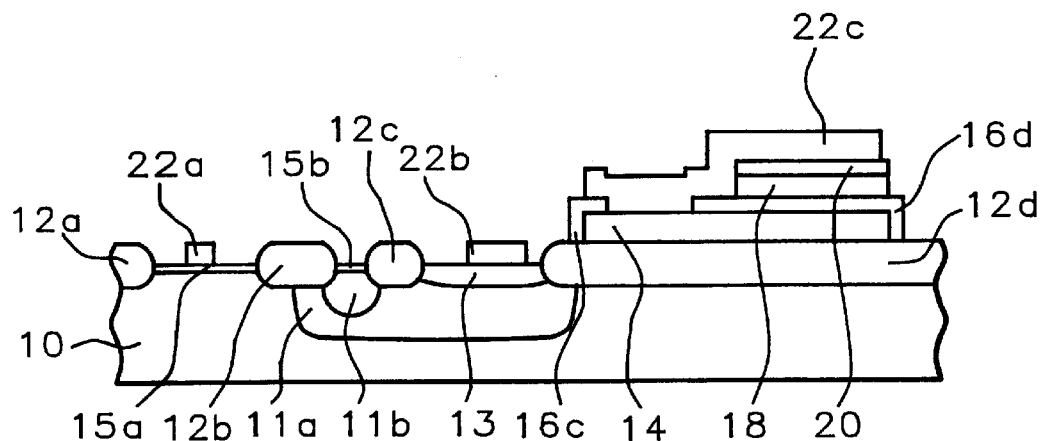
Figure 6:
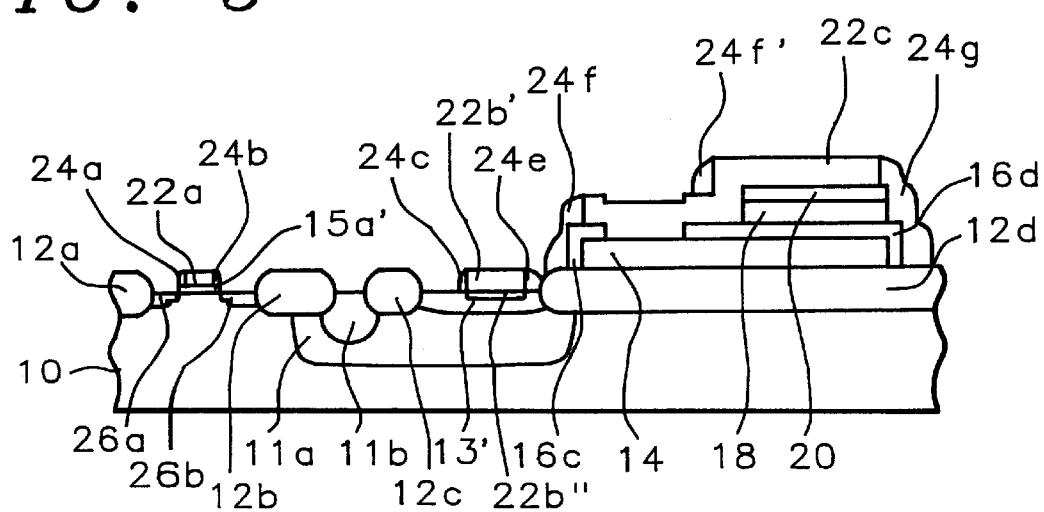

Referring now to FIG. 4 to FIG. 6, there is shown a series of schematic cross-sectional diagrams illustrating the results of progressive stages in forming within an integrated circuit a vertical polysilicon diode construction in accord with the second preferred embodiment of the present invention. Shown in FIG. 4 is a schematic cross-sectional diagram of the integrated circuit at an early stage in its fabrication.

Shown in FIG. 4 is a schematic cross-sectional diagram of an integrated circuit largely equivalent to the integrated circuit whose schematic cross-sectional diagram is illustrated in FIG. 1, but wherein there is a single patterned first polysilicon layer 14 formed therein upon the isolation region 12d rather than the two patterned first polysilicon layers 14a and 14b as illustrated in FIG. 1. Similarly, the single patterned first polysilicon layer 14 has formed self-aligned thereupon a single patterned first dielectric layer 16. Within the second preferred embodiment of the method of the present invention, the patterned first polysilicon layer 14 is preferably formed through methods, materials and thickness dimensions analogous or equivalent to the methods, materials and thickness dimensions employed in forming the patterned first polysilicon layers 14a and 14b within FIG. 1. Within the second preferred embodiment of the method of the present invention, the patterned first polysilicon layer 14 simultaneously serves as both: (1) a bottom diode electrode within a vertical polysilicon diode construction; and (2) a bottom capacitor electrode within a contiguous planar polysilicon capacitor. Thus, the width and area of the patterned first polysilicon layer 14 upon the isolation region 12d within the second preferred embodiment of the present invention is preferably approximately equal to the aggregate of the widths and areas of the patterned first polysilicon layers 14a and 14b upon the isolation region 12d within the first preferred embodiment of the present invention.

Referring now to FIG. 5, there is shown a schematic cross-sectional diagram illustrating the results of further processing of the integrated circuit whose schematic cross-sectional diagram is illustrated in FIG. 4.

Shown in FIG. 5 is the results of forming: (1) a pair of etched patterned first dielectric layers 16c and 16d from the patterned first dielectric layer 16 within the integrated circuit whose schematic cross-sectional diagram is illustrated in FIG. 4; (2) a patterned polysilicon gate electrode 22a upon the blanket gate dielectric layer 15; (3) a patterned polysilicon emitter electrode 22b upon the base region 13; and (4) a contiguous patterned polysilicon diode electrode and polysilicon capacitor plate 22e upon exposed portions of the etched patterned first dielectric layers 16c and 16d, the patterned first polysilicon layer 14, the patterned first capacitor dielectric layer 18 and the patterned second capacitor dielectric layer 20. Within the second preferred embodiment of the present invention, the etched patterned first dielectric layers 16c and 16d are preferably formed from the patterned first dielectric layer 16 through etching methods analogous or equivalent to the etching methods employed in forming the etched patterned first dielectric layers 16a' and 16a" from the patterned first dielectric layer 16a within the first preferred embodiment of the present invention. Similarly, the patterned polysilicon gate electrode 22a, the patterned polysilicon emitter electrode 22b and the contiguous patterned polysilicon diode electrode and polysilicon capacitor plate 22e within the second preferred embodiment of the present invention are preferably formed through methods, materials and thickness dimensions analogous or equivalent to the methods, materials and thickness dimensions employed in forming the patterned polysilicon gate electrode 22a, the patterned polysilicon emitter electrode 22b, the patterned polysilicon diode electrode 22c and the patterned polysilicon capacitor plate 22d within the first preferred embodiment of the present invention. Analogously with the patterned first polysilicon layer 14, the contiguous patterned polysilicon diode electrode and polysilicon capacitor plate 22e formed within the second preferred embodiment of the present invention is preferably formed of a width and area approximately equal to the aggregate of the widths and areas of the patterned polysilicon diode electrode 22c and the patterned polysilicon capacitor plate 22d formed within the first preferred embodiment of the present invention.

Referring now to FIG. 6, there is shown a schematic cross-sectional diagram illustrating the results of further processing of the integrated circuit whose schematic cross-sectional diagram is illustrated in FIG. 5. Shown in FIG. 6 is a schematic cross-sectional diagram of an integrated circuit largely analogous to the integrated circuit whose schematic cross-sectional diagram is illustrated in FIG. 3, as further structurally modified to provide consistency with FIG. 4 and FIG. 5. Due to the structural modifications to provide consistency with FIG. 4 and FIG. 5, there is formed within FIG. 6 an insulator spacer 24f' in place of the insulator spacer 24f as illustrated in FIG. 3. Upon forming through the second preferred embodiment of the method of the present invention the integrated circuit whose schematic cross-sectional diagram is illustrated in FIG. 6, there is formed, similarly with the integrated circuit whose schematic cross-sectional diagram is illustrated in FIG. 3, an integrated circuit having formed therein a portion of a bipolar complementary metal oxide semiconductor (BiCMOS) integrated circuit structure. In contrast with the integrated circuit whose schematic cross-sectional diagram is illustrated in FIG. 3, however, within the integrated circuit whose schematic cross-sectional diagram is illustrated by FIG. 6 there is formed an integrated contiguous planar polysilicon capacitor and vertical polysilicon diode construction rather than a planar polysilicon capacitor separate and independent of the vertical polysilicon diode construction as illustrated in FIG. 3. Similarly with the integrated circuit whose schematic cross-sectional diagram is illustrated in FIG. 3, and in accord with the objects of the present invention, each of the planar polysilicon capacitor and the vertical polysilicon diode construction within the integrated contiguous planar polysilicon capacitor and vertical polysilicon diode construction as illustrated within FIG. 6 is electrically isolated from a semiconductor substrate by means of an isolation region.

As is understood by a person skilled in the art, the first preferred embodiment of the method of the present invention and the vertical polysilicon diode construction formed through the first preferred embodiment of the method of the present invention, as well as the second preferred embodiment of the method of the present invention and the contiguous planar polysilicon capacitor and vertical polysilicon diode construction formed through the second preferred embodiment of the method of the present invention are illustrative of the present invention rather than limiting of the present invention. Revisions and modifications may be made to methods, materials, structures and dimensions through which is formed the vertical polysilicon diode construction of the first preferred embodiment of the method of the present invention and the integrated contiguous planar polysilicon capacitor and vertical polysilicon diode construction of the second preferred embodiment of the method of the present invention while still forming vertical polysilicon diode constructions which are within the spirit and scope of the present invention, as defined by the appended claims.

What is claimed is:

1. A junction diode structure formed within an integrated circuit comprising:

a semiconductor substrate;

a dielectric layer formed over the semiconductor substrate;

a first polysilicon layer formed upon the dielectric layer, the first polysilicon layer having a first dopant polarity and a first dopant concentration;

a second polysilicon layer formed at least in part overlapping and at least in part in contact with the first polysilicon layer, the second polysilicon layer having a second dopant polarity and a second dopant concentration, the second dopant polarity being opposite to the first dopant polarity, where a first portion of the second polysilicon layer overlapping and in contact within a first portion of the first polysilicon layer comprises a junction diode; and a second dielectric layer separating a second portion of the first polysilicon from a second portion of the second polysilicon layer, where the second portion of the first polysilicon layer is contiguous with the first portion of the first polysilicon layer and the second portion of the second polysilicon layer is contiguous with the first portion of the second polysilicon layer, thus forming a polysilicon capacitor contiguous with and in parallel with the junction diode, where the junction diode is electrically isolated from the semiconductor substrate.

2. The junction diode structure of claim 1 wherein the thickness of the first polysilicon layer is from about 2000 to about 4000 angstroms.

3. The junction diode structure of claim 1 wherein the thickness of the second polysilicon layer is from about 2000 to about 4000 angstroms.

4. The junction diode structure of claim 1 wherein the first portion of the second polysilicon layer overlapping and in contact with the first portion of the first polysilicon layer has a surface area (ie: junction area) of from about 20 to about 30 square microns.

5. The junction diode structure of claim 1 wherein the polysilicon capacitor is also electrically isolated from the semiconductor substrate.

* * * * *

UNITED STATES PATENT AND TRADEMARK OFFICE
CERTIFICATE OF CORRECTION

PATENT NO. : 5,982,021
DATED : 11/09/99
INVENTOR(S) : Purakh Raj Verma

It is certified that error appears in the above-indentified patent and that said Letters Patent is hereby corrected as shown below:

ON THE TITLE PAGE:

Title page, item (75), delete "Woodlands", and replace with --Singapore--; so that the Inventor's name and residence reads; Purakh Raj Verma, Singapore, Singapore.

Signed and Sealed this

Sixth Day of March, 2001

Attest:

NICHOLAS P. GODICI

Attesting Officer

Acting Director of the United States Patent and Trademark Office